United States Patent
Alén Millán et al.

(10) Patent No.: US 11,152,535 B2
(45) Date of Patent: Oct. 19, 2021

(54) MONOLITHIC QUANTUM LIGHT SOURCE DEVICE AND QUANTUM OPTICAL CIRCUIT THEREOF

(71) Applicant: CONSEJO SUPERIOR DE INVESTIGACIONES CIENTÍFICAS (CSIC), Madrid (ES)

(72) Inventors: Benito Alén Millán, Madrid (ES); David Fuster Signes, Madrid (ES); Yolanda González Díaz, Madrid (ES); Luisa González Sotos, Madrid (ES)

(73) Assignee: CONSEJO SUPERIOR DE INVESTIGACIONES CIENTIFICAS (CSIC), Madrid (ES)

( * ) Notice: Subject to any disclaimer, the term of this patent is extended or adjusted under 35 U.S.C. 154(b) by 122 days.

(21) Appl. No.: 16/479,773

(22) PCT Filed: Feb. 6, 2018

(86) PCT No.: PCT/EP2018/052960
§ 371 (c)(1),
(2) Date: Jul. 22, 2019

(87) PCT Pub. No.: WO2018/146096
PCT Pub. Date: Aug. 16, 2018

(65) Prior Publication Data
US 2020/0279972 A1    Sep. 3, 2020

(30) Foreign Application Priority Data
Feb. 8, 2017 (EP) .................................. 17382061

(51) Int. Cl.
*H01L 33/06* (2010.01)
*H01L 25/075* (2006.01)
*H01L 33/00* (2010.01)

(52) U.S. Cl.
CPC .......... *H01L 33/06* (2013.01); *H01L 25/0756* (2013.01); *H01L 33/0012* (2013.01); *H01L 33/0016* (2013.01)

(58) Field of Classification Search
CPC . H01L 33/06; H01L 25/0756; H01L 33/0012; H01L 33/0016
See application file for complete search history.

(56) References Cited

U.S. PATENT DOCUMENTS 5,583,349 A * 12/1996 Norman .............. H01L 25/0753
                                                                257/103
6,657,222 B1    12/2003 Foden et al.
(Continued)

FOREIGN PATENT DOCUMENTS

WO    2011009465 A1    1/2011

OTHER PUBLICATIONS

Zhiliang Yuan, "Electrically Driven Single-Photon Source", Article, Jan. 4, 2002, 102-105, vol. 295, Science.

*Primary Examiner* — Bilkis Jahan
(74) *Attorney, Agent, or Firm* — Hayes Soloway PC

(57) ABSTRACT

This document describes a device that is monolithic and capable of emitting quantum light without using previous configurations known in the art that require certain elements which yield certain disadvantages, which may be solved by implementing the device of the invention described herein. In this way the use of a transmitter which controls the state of charge or the wavelength of quantum light emitters independently of current in the device is implemented and does function properly when quantum light emitters are embedded in photonic structures, like microcavities or photonic crystals (PC); this is achieved by stacking semiconductor layers with different composition and doping types. A quantum light emitter circuit, which is a quantum optical (Continued)

circuit comprising at least two of said devices, is also an as aspect of the invention disclosed herein.

13 Claims, 8 Drawing Sheets

(56) References Cited

U.S. PATENT DOCUMENTS

| | | | |
|---|---|---|---|
| 6,720,571 B1 * | 4/2004 | Tu .......................... | B82Y 20/00 257/15 |
| 2002/0196827 A1 | 12/2002 | Shields et al. | |
| 2011/0108743 A1 | 5/2011 | Bennett et al. | |
| 2011/0108744 A1 | 5/2011 | Stevenson et al. | |
| 2016/0064439 A1 | 3/2016 | Or-Bach et al. | |

\* cited by examiner

MONOLITHIC QUANTUM LIGHT SOURCE DEVICE AND QUANTUM OPTICAL CIRCUIT THEREOF

CROSS-REFERENCE TO RELATED APPLICATIONS AND PRIORITY

This patent application claims priority from PCT Patent Application No. PCT/EP2018/052960 filed Feb. 6, 2018, which claims priority from European Patent Application No. EP17382061.4 filed Feb. 8, 2017. Each of these patent applications are herein incorporated by reference in its/their entirety.

OBJECT OF THE INVENTION

The object of the invention relates to the field of physics, specifically quantum physics.

The present invention is directed to a quantum light source, more specifically to a device capable of generating single photons or entangled photon pairs.

BACKGROUND OF THE INVENTION

The development of new quantum information technologies is the quintessential scope of quantum theories of light and matter. Even today, after many years of development of these theories, most devices work usually based on semi-classical theories where one aspect or another (or both) are considered a continuum medium.

Until today, even the smallest commercial transistor, despite its nanometer size features, can be described reasonably well with classical equations of equilibrium and charge transport. The same can be said for most emitting light devices and detectors where light is treated as a continuous electromagnetic wave. While recognizing the power of sophistication of these theories and their incredible range of application, is clear that, sooner or later, our technological maturity will exceed a critical barrier, from which the quantum properties of light and matter will be exploited to its full potential.

In 2013, the inhabitants of Western Europe spent 215 billion € on commercial transactions over the Internet and 72% of users carry out some kind of commercial transaction online. The aim of classical and quantum cryptography is to develop new methods and technologies which can preserve data privacy and security in modern telecommunications.

The first algorithm based on public key encryption was enacted over 30 years ago by Rivest, Shamir and Adleman and, even today, this algorithm (RSA) is used to encrypt the most part of the sensitive information from internet.

It is needed to understand that messages encrypted in that way are not inviolable. Its decryption is a tedious mathematic problem, but not insurmountable. Using a method of classic factorization, a modern desktop computer would need several millennia to decipher an encrypted message with a 256-bit RSA key. However, the task would be much less arduous if a quantum factoring algorithm running in quantum computer is used for the task. Although such an outcome cannot be expected soon, the ability of these quantum computers are 'in crescendo' with the recent demonstration of the factorization of five-digit numbers or 16 bits.

Alternately to public key methods, one-time-pad cryptography is secure against adversaries with infinite computation power. Its only flaw being that the method to exchange private keys must be proven unbreakable. Fortunately, quantum information theory not only causes a problem, the security breach of public key algorithms, but also offers "inviolable" methods for private key exchange. The best known cryptographic quantum protocol is the BB84, which is based on the "no cloning theorem of quantum states" which in turn derives from the principle of uncertainty. Information encoded in a quantum state is irreversibly modified during the measurement process. This enables various methods for two legitimate partners to exchange information encoded in quantum states and to notice when its privacy has been compromised. This exclusive property of quantum information protocols allows the inviolable exchange of absolutely private keys between legitimate interlocutors.

Single-photon sources are light sources that emit light as single particles or photons. They are distinct from coherent light sources (lasers) and thermal light sources (such as incandescent light bulbs and mercury-vapor lamps). The Heisenberg uncertainty principle dictates that a state with an exact number of photons of a single frequency cannot be created. However, Fock states (or number states) can be studied for a system where the electric field amplitude is distributed over a narrow bandwidth. In this context, a single-photon source gives rise to an effectively one-photon number state whereas an entangled photon pair source state gives rise to an effectively two-photon number state; being a Fock state or number state a quantum state of light that is an element of a Fock space with a well-defined number of quanta.

For quantum telecommunications, quantum states of light, like single photons or entangled photon pairs, are the preferred carriers of quantum information. To generate and manipulate them, numerous research groups and corporations spend countless efforts to make quantum light theories into applications and the latter into technologies. In fact, the so-called 1 quantum modems' already exist outside the laboratory as prototypes oriented to large corporations and institutional clients. For popularizing them, it is necessary that such technology pass through cycles of miniaturization and integration as has happened with other digital technologies since the invention of the microprocessor and Moore's Law. The key question is how to make a reliable, integrated and scalable quantum light source that can be used generally in new quantum information technologies.

Quantum properties of light were postulated by Einstein and Planck to explain black body radiation and the photoelectric effect in the early twentieth century. However, it was not until the 70s that the first experimental evidence of the quantum nature of light involving the detection of individual photons was found. It derives from this pioneering research that, from the point of view of a local observer, a light stream emitted by an individual quantum state of an atom is made of single photons (photons emitted one by one), but most light sources do not generally fulfil this rule. A simple way to look at it is that two unrelated individual atoms present in a certain light source can emit two unrelated photons simultaneously.

The following decades were fundamental to the development of quantum information theory but it is only since 1984, with the publication of the BB84 protocol, the advent of the Internet, and the growing concern of society for the safety of telecommunications, that quantum information theory and technology gradually achieved its present relevance Finding a suitable physical system to develop this technology is not easy. Despite the success of experiments on individual atoms and ions, it was obvious that these physical systems were not amenable to adapt new quantum protocols to existing telecommunication technologies based on semiconductor light sources and optical fibers. In the mid-90s, using individual molecules as quantum light emitters, a new path was opened showing that physical systems consisting of many atoms can also emit single photons if a single electron is excited every time.

It was not until the arrival of the new century than single photon sources in solid state systems were definitely demonstrated. It was reported almost simultaneously in color centers in diamond, colloidal CdTe quantum dots dispersed in glass, and InAs quantum dots grown on GaAs by epitaxial methods.

Over the years these studies have become popular and quantum light sources has been demonstrated in various quantum systems that can be classified into three categories:

I.—Quantum light emitters based on varying semiconductor materials nanostructured in a semiconductor matrix like GaAs, InP, GaN, and grown by epitaxial methods.

II.—Quantum light emitters based on organic and inorganic nanostructures and molecules dispersed on solid substrates or polymers.

III.—Quantum light emitters based on vacancies and defects embedded in crystals with large energy bandgap such as diamond or silicon carbide.

Mentioning all work and compare their results would take much more space than is available here, so we will comply with comparing InAs/GaAs quantum dots, colloidal quantum dots and nitrogen vacancies on diamond as representative of each category. The latter two operate smoothly at room temperature, while most quantum light sources of the first category require low temperatures (<77 K) to work properly. Temperature is a crucial advantage for the proposed technological objective, but not the only one. There are several practical and fundamental requirements that determine the actual potential of the different approaches to become an appropriate technology:

Wavelength: Currently, medium and long distance optical telecommunications are made through optical fibers. The signal attenuation is measured in dB/km and is low in the near infrared and short wavelength infrared, with a minimum at 1.55 microns, and much higher in the visible and ultraviolet ranges. The emission of GaAs-based and InP-based quantum dots covers the infrared range from 850 to 1700 nm naturally. Other systems typically emit in the visible or UV.

Integration: Modern optical information technologies are based on photonic integrated circuits where generation (detection) of light is packaged with signal processing components in a single photonic chip in the transmitter (receiver) side. It is an industry that follows the steps of miniaturization of the electronics industry. Semiconductor wafers and epitaxial materials are already used to manufacture light emitters and detectors, light amplifiers and also passive components, such as waveguides, using microplanar fabrication technologies known from the electronics industry. Diamond, due to its higher mechanical strength and chemical stability, or colloidal quantum dots, molecules, carbon nanotubes, . . . due to its poor durability or resilience to the environment may not be as appropriate or easy to adapt to existing manufacturing processes on an industrial scale. An exception to this rule is the SiC, whose use in electronics and optoelectronics is well known.

Electrically driven capability: The first solid state lasers were pumped with external light sources that excited the electrons of the active medium to higher energy levels. The first lasers able to convert electrical energy directly into coherent light were based on ionized gases in which the electrical current flew between the electrodes providing the excitation energy. These sources were still bulky instruments until the invention of, first, the double heterostructure laser diode, and, later, the quantum well laser diode. These compact light sources, with low power consumption and high modulation rate, made possible the direct conversion of electrical data into light as demanded in modern telecommunications. It is clear that if the aim is the integration and miniaturization, electrically driven quantum light sources made of durable and easily manufactured semiconductor materials, including OLEDs, offer great advantages over other alternatives that are not so developed in this aspect.

Indistinguishability of photons: The indistinguishability of individual photons emitted by the source is an essential parameter in quantum processing algorithms and also in quantum cryptography protocols. The indistinguishability is measured as the absence of differences between wave packets describing two photons of the same source. Its enemy is random phase shifts caused by the environment during the generation process (pure dephasing).

Electrons responsible for the emission of photons in a solid state environment are subjected to unwanted interactions among themselves and with other excitations of the crystal lattice (i.e. phonons) which broadens the emission linewidth (measured in Hz) of the emitted photon beyond the inverse of its lifetime (the latter case would be an ideally Fourier transformed photon). The linewidth of the photons emitted by impurities in diamond at room temperature is several orders of magnitude higher than those emitted by confined excitons in InAs quantum dots. Lowering the temperature to 1.8 K, both become comparable, but then the diamond loses its main technological advantage (room temperature operation) over epitaxial quantum emitters.

The exclusive advantages of quantum light emitters of category I were exploited by Toshiba Laboratories (Cambridge) in 2002. Soon after the demonstration of single photon emission in InAs/GaAs quantum dots, Toshiba Labs. developed the first monolithic quantum light source based on direct electrical injection. Toshiba design consists of a p-i-n diode in whose intrinsic region InGaAs self-assembled quantum dots are grown by molecular beam epitaxy (MBE). Applying a direct bias to the diode, the majority carriers are injected from the doped layers to the quantum dots producing light. If the light of a single quantum dot is spatially and spectrally filtered, the result is a quantum light source with electrical injection.

The design presented and validated by Toshiba in US2002196827A1 presents great advantages over excitation by an external light source (especially in terms of energy consumption and system integration) and also comes with some problems described in the next section and that our proposal is intended to remedy. With a few variations, the Toshiba's p-i-n design has been used to manufacture monolithic quantum light sources with different materials of category I. In the other categories, this design has been gradually replicated exploring the feasibility of power line generation of quantum light in a wider range of materials.

The design of Toshiba Labs (2002) remains immovable and although it has been improved, by themselves and by others, to increase efficiency or to produce pairs of entangled photons, all subsequent developments are based on a two-terminal device with a single active region containing quantum dots/defects and two doped regions to inject electrical carriers from.

The two-terminal design has several disadvantages:

1.—Conflicting Control of Several Key Parameters:

An external electric field is a valuable resource to control the emission wavelength and the charge state of quantum light emitters of category I through quantum confined Stark effect and capacitive coulomb charging, respectively. A design based on a single p-i-n junction makes difficult, when not impossible, to control the state of charge of the emitter and/or its emission wavelength independently of the electrical current injected in the device. As seen in the pioneer Toshiba's work, the quantum light emitter operates at a single wavelength only for the lowest currents (<80 nA). For higher currents, new emission lines appear at lower energies and for higher emission currents it becomes a continuous spectrum. In practice this would mean the appearance of unwanted new light sources and the emission of more than a single photon simultaneously. This hampers the control over the brightness of the quantum light source because the number of photons per second, determined by the injected current, cannot be varied much without affecting the wavelength or quantum character of the emitted photons. This drawback is shared by all electrically driven quantum light sources based on the Toshiba's design.

2.—Limited Performance in Ultrathin Membranes:

The two-terminal-design cannot be easily applied to situations where quantum dots are embedded in ultrathin membranes. An example of paramount practical importance is the fabrication of electrically driven quantum light sources based on photonic crystal microcavities (PCM) embedding, for instance, quantum dots. PCMs are a crucial component in integrated quantum photonics that increase the brightness of a quantum light source through the Purcell effect (weak light-matter coupling). They are also fundamental to develop quantum repeaters and spin-photon interfaces based on cavity quantum electrodynamics (strong light-matter coupling). In both cases, the spectral tuning between the cavity mode and the quantum light emitter energy is crucial. Some groups have used two terminal devices to control by an external electric field the emission wavelength of quantum light emitters embedded in such microcavities (Stark effect). Also, broad and weak electroluminescence from a collection of quantum light emitters embedded in a PCM has been demonstrated.

Yet, despite the large potential of PCMs for integrated quantum photonics, electrically driven quantum light sources are very hard to embed in PCMs. The reason is that the photonic crystal is extremely sensitive to its dielectric environment and therefore, metallic electrodes cannot be deposited on top of the PCM without drastically reducing its quality factor (a crucial parameter for both applications mentioned above). Due to this fundamental restriction, metallic electrodes must be deposited away from the PC boundaries (typically ~20 microns or more) largely increasing the path that majority carriers need to travel laterally before arriving to the quantum emitter (located at the PCM center). While ~20 microns is a reasonable distance for most optoelectronic applications, the PCMs relevant here are fabricated on a ~100-nm-thick membrane which, according to the two-terminal design, shall contain the carrier injection p-i-n structure. In such case, doped layers can be only ~30-nm-thick making the sheet resistance not only intrinsically high but also worsened by the PC manufacturing process. Therefore, such device has been explored mostly as a means to control the quantum light emitter wavelength by applying an electric field in reverse bias. In this case the majority carrier current neither is necessary nor play a role.

Another application field where quantum light emitters benefit of the use of ultrathin membranes is related to strain engineering of the quantum states. This is particularly relevant for the production of entangled photon pairs (EPP) using quantum light emitters of type I and III. The as grown emitters generally do not emit EPPs unless their broken crystal symmetries are restored by applying an external field in the growth plane. The use of ultrathin membranes makes possible to engineer those states with moderate externally applied mechanical forces (typically induced by piezoelectric transducers). Adding electrically driven carrier injection and strain engineering in a monolithic device will impact the development of quantum light sources, quantum repeaters and memories, and with existing designs, it is also impaired by the high sheet resistance of ultrathin membranes as explained above.

The same disadvantage hampers the development of integrated quantum sensors based on interrogating cantilevers, membranes and other ultrathin nano-optomechanical resonators with quantum light.

3.—Limited System Integration:

Integrated quantum photonic circuits (IQPC), just as any other integrated photonic circuit, are based on the integration of multiple functionalities on a single chip. Electrically driven quantum light sources and memories are just the first of a long list of passive and active components which includes waveguides, phase modulators, light detectors, optomechanical resonators, Quantum light sources based on the two terminal design exhibit conflicting control of several key parameters and limited performance in ultrathin membranes which impair the integration of these monolithic components in IQPC. To a greater extent than trapped atoms and ions, quantum light sources and memories based on solid state systems suffer from inhomogeneous broadening caused by statistical fluctuations of their properties and/or in their environment. For quantum photonic circuit applications, different components must be tuned in independently, and for ultimate IQPC, this must be done locally using wisely the available space. As pointed out in 1, the two-terminal-design lacks of enough flexibility to change key parameters, like quantum light source wavelength or brightness, in an independent way (tune in requirements) or, as pointed out in 2, it cannot be easily implemented on photonic crystal membranes or ultrathin components in general (space requirements). These are just a few examples of the many problems that a redesigned monolithic design can mitigate as explained in the description of the invention section below.

Prior Art for Monolithic Quantum Light Source Devices

In the original design of Toshiba, carriers are injected from the doped layers of a p-i-n diode to generate directly "electroluminescence in the embedded quantum light emitters". The electroluminescence intensity is controlled varying the device bias and quantum properties of this light arise from spectral and spatial filtering of the photon stream.

There are several developments aimed to provide partial solutions to some aspects addressed by the object of the invention:

Yuan in "Electrically Driven Single-Photon Source" Science 295 (5552) 102-5 Feb. 2002 discloses a radiation source electrically induced of single photon generated from the electroluminescence of a single quantum dot disclosed in the intrinsic region of a p-i-n junction type, that is a PIN diode having two differently doped regions and two terminals. This document details how under low levels of injection current, the spectrum of the quantum dot electroluminescence reveals a single sharp line due to recombination of excitons. The second order autocorrelation function of the emitted light shows that single-photon emission on-demand can be stimulated by sub-nanosecond-long voltage pulses.

Together with Toshiba's activities, for example in the document US2011108744 a photon source is described comprising: a quantum dot; electrical contacts configured to apply an electric field through said quantum dot: and a power source coupled to said contacts, said electrical source is configured to apply a potential such that the carriers are supplied to said quantum dot to form a bi-exciton or an exciton of higher order. In that document the said source of photons further comprises a barrier configured to increase the time that a carrier takes to get to and from said quantum dot, and that time being greater than the lifetime of radiation of an exciton in the quantum dot, the quantum dot being suitable for photon emission during the disintegration of a bi-exciton, exciton or higher order.

WO2011009465 describes a source of photon quantum light based on an essentially conical nanowire that is made from a semiconductor material; the nanowire is complemented by a pair of electrodes electrically connected to a photon emitter that is integrated into the nanowire and can generate or emit a single photon when a driving voltage is applied between the electrodes. This document describes that the nanowire is surrounded by air or vacuum, so that you can take advantage of the resulting relationship between the refractive index of the nanowires and the material surrounding (air). It also details that the electrodes are optically transparent so that can be used as part of an antireflective element.

DESCRIPTION OF THE INVENTION

The aforementioned disadvantages present in the prior art can be solved by implementing the tunable monolithic quantum light source device and quantum optical circuit thereof of the invention, which changes the concept of quantum light emitting diode proposed in the prior art and the injection mode of the majority carriers.

For this purpose, the tunable monolithic quantum light source device, which is a quantum light emitting device capable of producing quantum light according to the n-photon Fock states classification (i.e. a single-photon source producing one-photon number states or an entangled photon pair source producing two-photon number states and so on), provides a new terminal and a new device active layer.

Note that in the quantum light emitting device object of the invention, the in-situ conversion of classical light into quantum light is performed without involving any non-linear optical process; which can be said to be one of the key elements of the quantum light emitting device object of the invention. Several non-linear optical processes like parametric down-conversion can produce single photons and entangled photon pairs by frequency conversion within a non-linear medium of a pumping light source. The pump light is typically provided by an external high-power laser source. Although attempts could be made to integrate the pump source and the non-linear medium monolithically making use of semiconductor compounds, the design and working principles of such device would be very different of the object of invention.

Therefore, the object of the invention is a monolithic device capable of generating quantum light from a voltage source, such as a battery, while tuning independently its key properties, like wavelength and brightness. As a LED lights up our streets converting an electric current into a powerful white light, or a laser diode read and records data on a DVD, our device will convert an electrical current into highly indistinguishable single photons or entangled photon pairs without requiring other active components apart of the said monolithic device.

The object of invention finds a solution for a well-known problem of existing electrically driven quantum light sources which have limited performance when implemented in ultrathin membranes, photonic crystal microcavities and waveguides or more generally, nanodevices sensitive to its dielectric environment. In all these cases, the new design solves the problem without compromising the monolithic character of the source.

Due to its new tuning capability and optical integration feasibility, the object of the invention improves the current monolithic sources of quantum light, and have great potential in quantum communications, but also opens the door to more feasible photonic integrated circuits for quantum information processing and metrology.

The device of the invention comprises a set of diodes, preferably two, and a set of intrinsic areas, preferably two, in a monolithic structure "p-i-n-i-p". The lower intrinsic and doped layers comprise one or more quantum wells (QW), while the upper intrinsic layers contain preferably a single layer comprising quantum light emitters (for instance epitaxial QDs). The bottom diode operates in forward bias, that is, by injecting majority carriers producing "electroluminescence in QW". This classic light (Clight) is in fact the conventional light emitted by a light emitting diode (LED) which propagates through the device until it reaches the upper active zone containing the quantum light emitters. In this region, the classical light is absorbed generating electron-hole pairs which are captured by the quantum light emitters and re-emitted as quantum light. The quantum light is then collected following the known methods for time, spatial and spectral filtering of quantum light sources as needed. The upper diode can be driven independently and enable a number of functionalities not present in the two-terminal design:

Control of the quantum light emitter energy thorough quantum confined Stark effect and thus of the quantum light source wavelength independently of the carrier injection mechanism.
  Control of the QD charging state through capacitive or diffusive loading and unloading of additional electrical carriers independently of the carrier injection mechanism.
  Modulation of the quantum light source intensity or brightness using two independent parameters: current injection in the lower diode (modulation of classical light intensity) or reverse electric field of the upper diode (full depletion of charge in the QDs).
  Full electrical driving of quantum light sources or quantum memories embedded in ultrathin membranes, including photonic crystal microcavities/waveguides, nano-optomechanical sensors, strain engineering membranes and so on, without impairing the dielectric environment or the quantum light source brightness.

The three-terminal design enables the implementation of complex vertical and/or lateral electrical gating of the quantum light emitter states independently of the injection level of the monolithically embedded pumping light source. This is of paramount importance to fulfill the feasible tune-in and space-saving requirements of highly integrated quantum photonic circuits. More specifically, it enables:

The use of sacrificial and etch-stop layers and standard microfabrication methods, to remove completely or selectively one or more doped layers and to define passive regions, electrically reversed active regions, lateral gates, Schottky gates, field effect transistors and so on, all operating in the same wafer independently of the injection level of the monolithically embedded pumping classical light source.

Also, the three-terminals concept do not impose any particular restriction to the construction of the monolithically embedded pumping light source neither to the design of the quantum light source. In particular:

Every present and future development in the field of classical light emitting devices can be implemented. Particularly, instead of conventional LED designs, Bragg reflectors can be used to manufacture resonant cavity LEDs or Vertical Cavity lasers (VCSELs) to narrow the classical light spectrum and increase its modulation rate and depth. Current confinement strategies based on forming current blocking layers, by anodic oxidation or other method, can be also implemented to channel or block the current in the lower or upper diode and increase the efficiency/modulation rate and depth as well. All these developments can be incorporated effortlessly to the design to improve the monolithic electrical generation of single photons and entangled photon pairs on demand.

Every present and future development in the search of new materials for quantum light source fabrication can be incorporated. In particular, quantum light emitters can be made of any combination of materials able to hold single carriers and/or emit quantum light while able to absorb the pumping light. Also, deterministic methods of fabrication based on site controlled quantum light emitters or selectively addressed quantum light emitters are fully compatible with our design.

DESCRIPTION OF THE DRAWINGS

To complement the description made and in order to aid a better understanding of the characteristics of the invention according to a preferred practical embodiment thereof, accompanying as an integral part of said description, a set of drawings wherein, illustratively and not restrictively, the following has been represented.

At the same time, their quantum light emission can be electrically driven within the same device.

Figure 10:
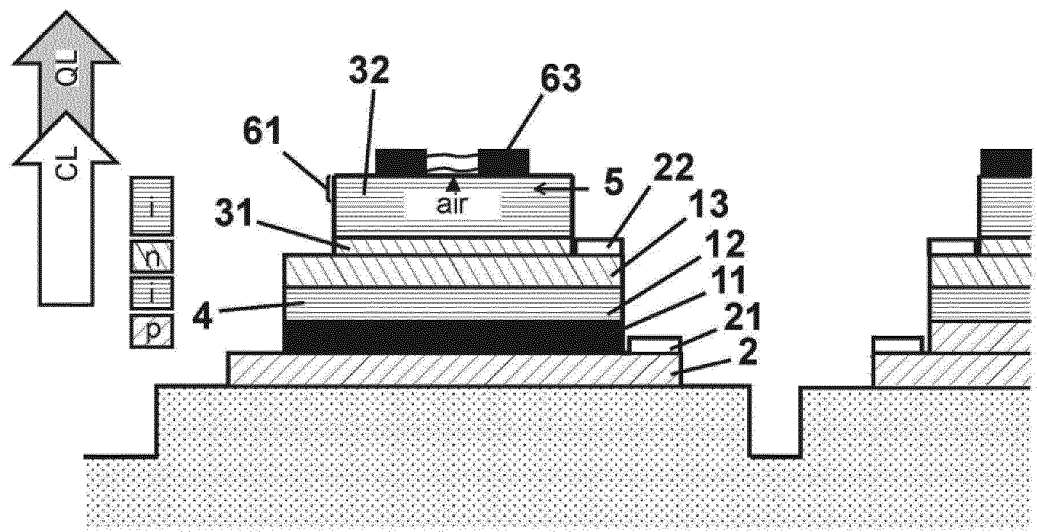

FIG. 10.—Shows an illustration of the device of the invention where quantum emitters are embedded in a membrane and their properties tuned by the stress or heat applied with an external transducer. At the same time, their quantum light emission can be electrically driven within the same device.

Figure 11:
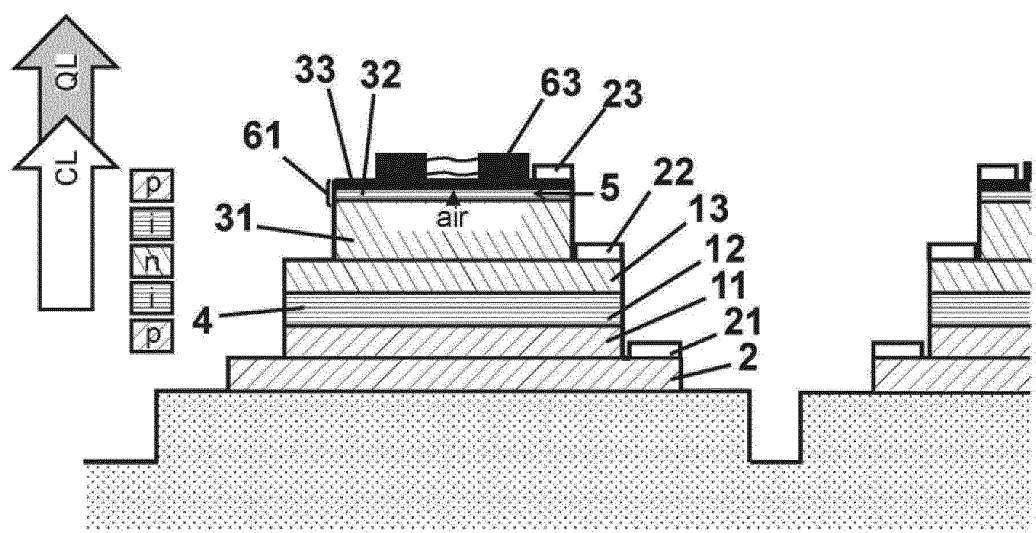

FIG. 11.—Shows an illustration of the device of the invention where quantum emitters are embedded in a p-i-n junction within a membrane to tune their properties by the applied voltage and/or by the stress or heat applied with an external transducer. At the same time, their quantum light emission can be electrically driven within the same device.

Figure 12:
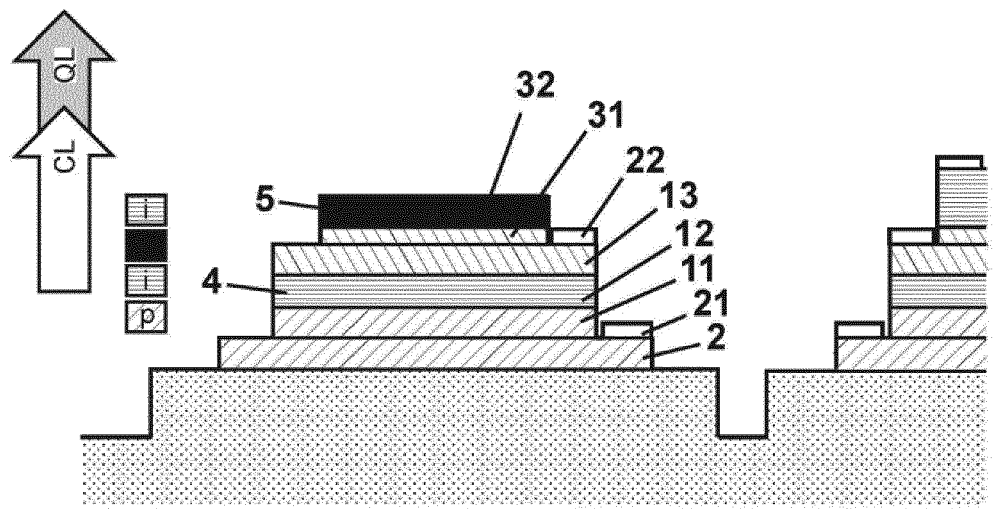

FIG. 12.—Shows a diagram of a tunable quantum light source array comprising two or more devices of the invention from the same substrate. To implement different functionalities, active and passive epitaxial layers can be removed selectively from each device. Each of the remaining active layers can be driven independently with different bias. At the same time, their quantum light emission can be electrically driven within the same device.

Figure 13:
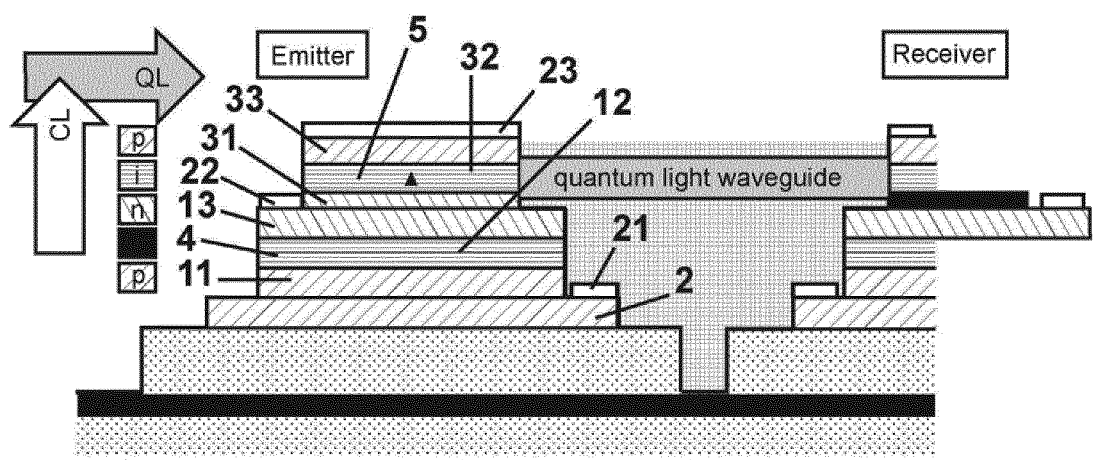

FIG. 13.—Shows a diagram of a basic quantum optical circuit comprising two or more devices of the invention from the same substrate. The devices are interconnected within the circuit by light waveguides and absorbers. The devices can be biased independently to emit, detect or alter the properties of quantum light. At the same time, their quantum light emission can be electrically driven within the same device.

Figure 14:
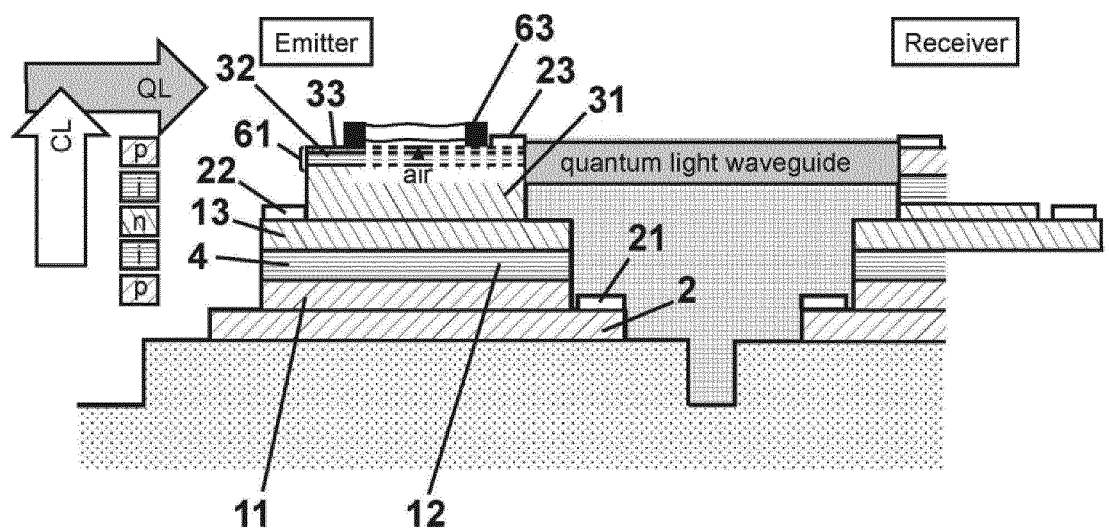

FIG. 14.—Shows a diagram of a basic quantum optical circuit comprising two or more devices of the invention from the same substrate. Quantum properties of the quantum emitters/receivers are controlled by external piezoelectric transducers, heaters and/or internal electric fields. The devices are connected by light waveguides and/or absorbers. Quantum Light is trapped and directed to the circuit with photonic crystal microcavities and waveguides. The devices can be biased independently to emit, detect or alter the properties of quantum light. At the same time, their quantum light emission can be electrically driven within the same device.

Figure 15:
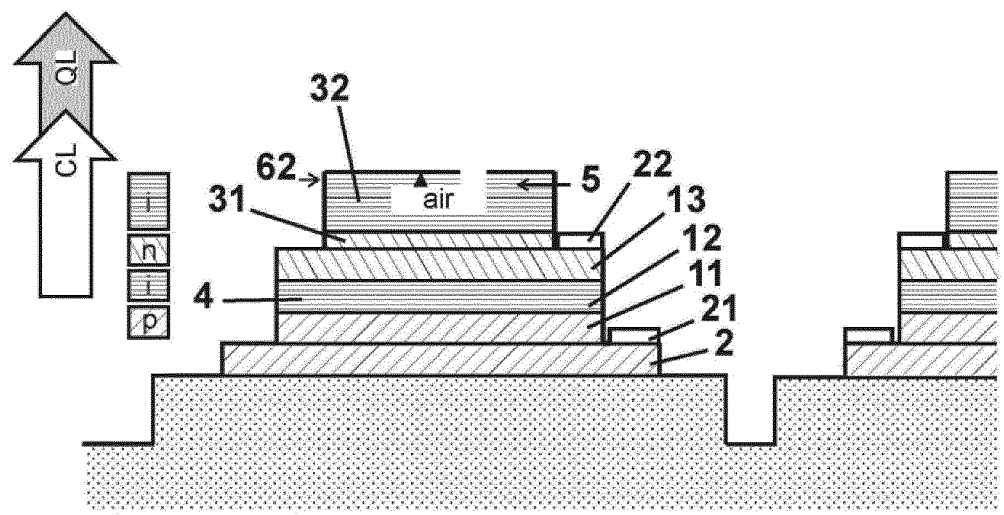

FIG. 15.—Shows an illustration of the device of the invention where the quantum emitters are embedded in a nanooptomechanical device like a cantilever for quantum metrology and sensing applications and their quantum light emission can be electrically driven within the same device.

PREFERRED EMBODIMENT OF THE INVENTION

Figure 1A:
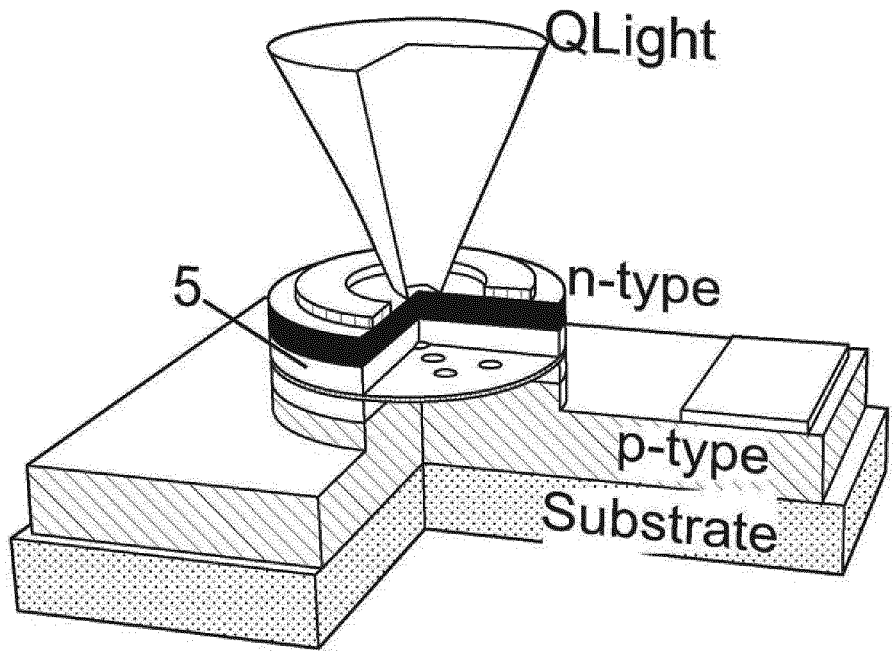
FIGS. 1a-1b.—Shows a perspective view of the state of the art in FIG. 1a and a perspective view of the device of the invention in FIG. 1b.
Figure 1B:
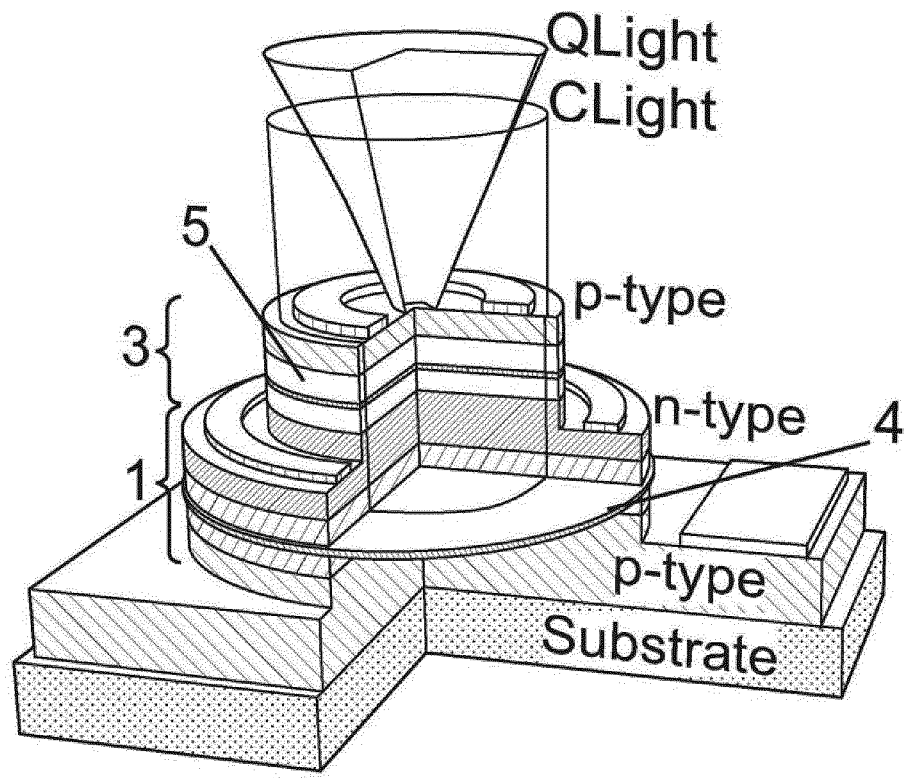
Figure 2:
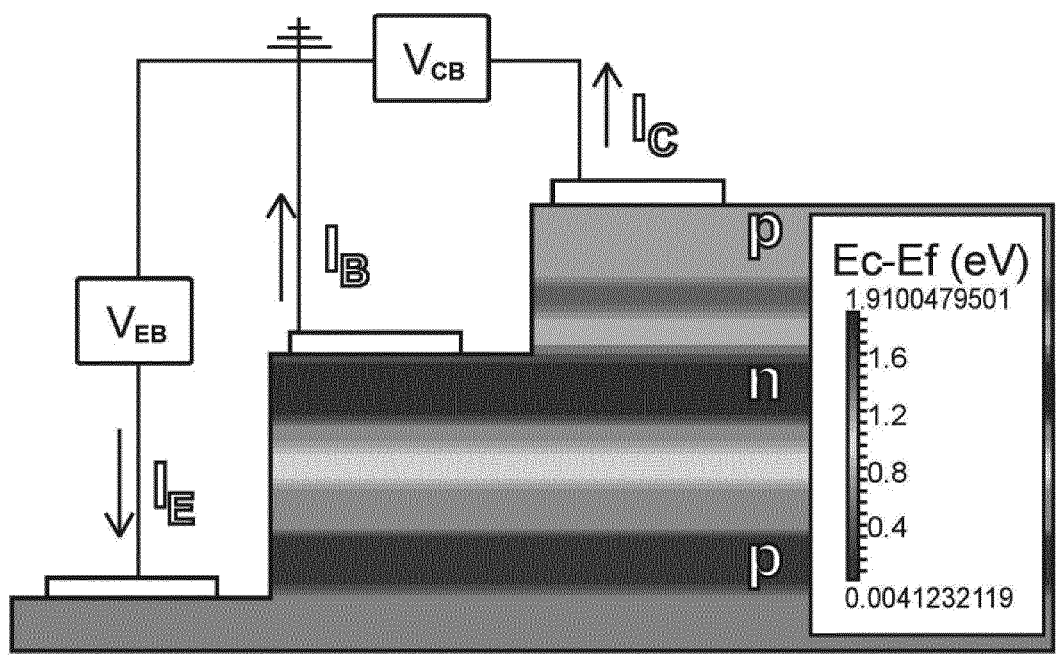
FIG. 2.—Shows a finite elements method simulation attained solving self-consistently the Poisson and drift-diffusion equations in the device. The color map indicates the energy of the electrons with VEB=VCB=0 V.
Figure 3:
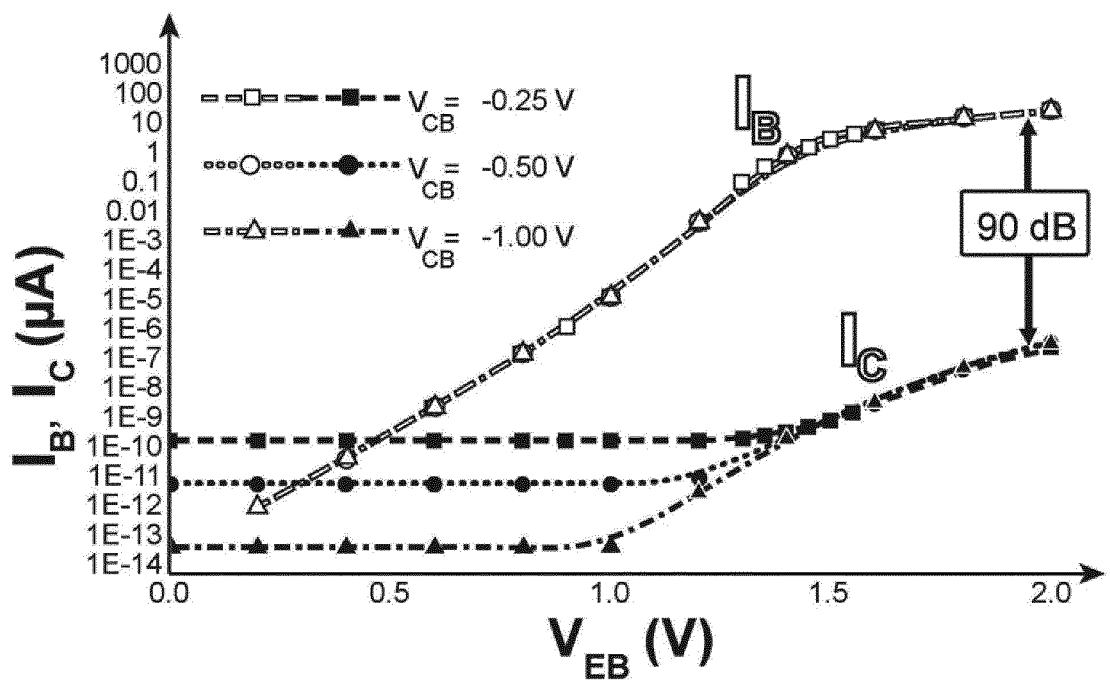
FIG. 3.—Shows the calculated base and collector currents for different VCE and VBE with the transport equations solved like in a bipolar transistor in common base configuration. The design for the tunable quantum light emitter has been optimized to damp almost completely the transistor effect (90 dBs attenuation), i.e., all the current injected by the emitter is dedicated to generate electroluminescence in the quantum wells.
Figure 4:
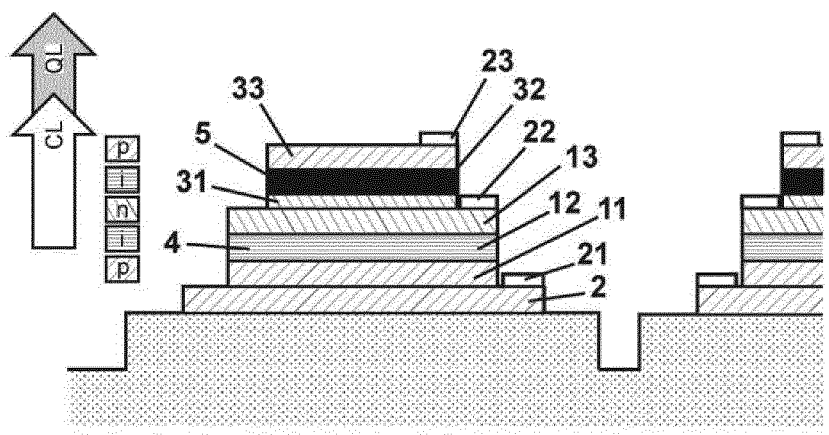
FIG. 4.—Shows an illustration of a p-i-n-i-p configuration of the device of the invention as a monolithic source of quantum light with electrically tunable quantum properties.

In a possible preferred embodiment of the device of a first aspect of the invention, it is provided a device capable of emitting quantum light as shown in FIGS. 1b and 4 having at least a lower diode (1), which must be partially transparent to the light emitted by at least a quantum well (4), and at least one upper diode (3) that should partially or completely absorb said emitted light; wherein quantum light emitters. This is not a problem in practice since there are various combinations of semiconductor materials that meet this rule.

In a possible preferred configuration, the device of the invention comprises several zones with different doping p-i-n-i-p or alternatively n-i-p-i-n; although a device can be developed with a number of specific zones, as five as in the device shown in FIG. 1b; in this way they have alternating layers of p-type, intrinsic or n-type semiconductor, pairs of layers with respective layers of p-type semiconductor and n-type semiconductor between which diodes (1,3) are arranged.

Thus a basic design of the device shown in either FIG. 1b or FIG. 4, may comprise, on a substrate that may be doped (n-type or p-type) or intrinsic, block (2) of semiconductor material which in turn may be respectively doped and selected between n-type or p-type semiconductor materials; it is worth mentioning that the material of the substrate depends on that of the block (2), so the substrate is made of a n-type or intrinsic material when block (2) is of n-type, or p-type or intrinsic material when the block (2) is made of p-type. The selection of n-type or p-type semiconductor materials rendered the abovementioned p-i-n-i-p or alternatively n-i-p-i-n structures; This basic design is the cornerstone of a preferred embodiment of the invention where, regardless of the semiconductor materials which are preferably selected from III-V compound semiconductor materials and taking into the account possible different arrangements of n-type, p-type and intrinsic material layers, a quantum light emitting device is formed which is monolithic and comprises on said block (2), being in this preferred embodiment a p-type semiconductor material block (2):

A lower diode (1) comprising the block (2) and on top of said block a first layer of semiconductor material (11) which may have the same composition than block (2) being preferably made of p-type semiconductor material, a second layer of semiconductor material (12), being preferably made of intrinsic material, said second layer of semiconductor material (12) may comprise quantum wells (4); Situated on the second layer of semiconductor material (12), a third layer of semiconductor material (13), in this case preferably made of n-type semiconductor material that may comprise also quantum wells (4) is provided. It is deemed to be functional that the device with one or more than one quantum wells (4) would work nonetheless, and for the sake of concreteness, a plurality of quantum wells (4) are hereby provided.

An upper diode (3) comprising a fourth layer of semiconductor material (31) which may have the same composition than that of the third layer of semiconductor material (13) being preferably made of n-type semiconductor material; and a fifth layer of semiconductor material (32) located on top of the fourth layer of semiconductor material (31) and that is preferably made of intrinsic material, fifth layer of semiconductor material (32) which in turn may comprise quantum light emitters (5), that may be i.e. semiconductor quantum dots (5) or other quantum materials able to emit quantum light i.e. carbon nanotubes, organic molecules, single layer materials, . . . . On top of said fifth layer of semiconductor material (32) a sixth layer of semiconductor material (33) is provided, said sixth layer of semiconductor material (33) being preferably made of p-type semiconductor material.

A first metal layer (21) is also provided located either on the first layer of semiconductor material (11) or semiconductor material block (2) generating an ohmic electrical contact to at least one of said semiconductor materials, thus forming a first electrical contact. A second metal layer (22) is also provided located either on the third layer of semiconductor material (13) or the fourth layer of semiconductor material (31) generating an ohmic electrical contact to at least one of said semiconductor materials, thus forming a second electrical contact. A third metal layer (23) is also provided located on the sixth layer of semiconductor material (32) generating an ohmic electrical contact to said semiconductor materials (32), thus forming a third electrical contact.

As earlier mentioned the device of the invention may be provided with possible different arrangements of n-type, p-type and intrinsic semiconductor materials for the layers of semiconductor material (11, 12, 13, 31, 32, 33); in this sense in possible alternative embodiments of the device of the invention, the block (2) and the first layer of semiconductor material (11) is made of n-type semiconductor material, the second (12) and fifth (32) layers of semiconductor materials are made of intrinsic semiconductor material, the third (13) and fourth (31) layers of semiconductor material is made of p-type semiconductor material and the sixth semiconductor layer (33) is made of n-type semiconductor material. Reversing the configuration of semiconductor materials renders configurations p-i-n-i-p or alternatively n-i-p-i-n; where i denotes an intrinsic layer.

The device of the invention may render different configurations based on the base model above described; accordingly, the third layer of semiconductor material (13), which is located on the second layer of semiconductor material (12), may be made of p-type semiconductor material when first layer of semiconductor material (11) is of n-type semiconductor material, or n-type semiconductor material when the first layer of semiconductor material (11) is of p-type semiconductor material. Similarly, the fourth layer of semiconductor material (31), which is arranged on the third layer of semiconductor material (13) maybe made of p-type semiconductor material when first layer of semiconductor material (11) is of n-type semiconductor material, or n-type semiconductor material when the first layer of semiconductor material (11) is of p-type semiconductor material. In a similar manner, fifth layer of semiconductor material (32) located on top of the fourth layer of semiconductor material (31) and comprising in turn at least one quantum well (4) when the second layer of semiconductor material (12) comprises at least one quantum light emitter (5), or at least one quantum light emitter (5) when the second layer of semiconductor material (12) comprises at least one quantum well (4). All the possible embodiments of the device of the invention may start from any one of the above initial configurations.

In an alternative embodiment of the device of the invention where the second layer of semiconductor material (12) comprises at least one quantum well (4), in this embodiment the third metal layer (23) and sixth layer of semiconductor material (33) may be removed or the sixth layer of semiconductor material (33) may be replaced by an electrical isolating layer or a metallic layer.

In the case shown in FIG. 1b, the device is designed to emit quantum light at around 980 nm thus the lower diode (1) is made of a combination of III-V compound semiconductors—in this case $Al_xGa_{1-x}As$ of varying composition—, and it contains quantum wells (4) of GaAs with emission at around 785 nm, while the upper diode (3) is made of a combination of III-V compound semiconductors—in this case GaAs and its absorption coefficient is $>10^5$ cm$^{-1}$ to this wavelength. The fourth layer 32 contains one or more quantum dots made of $In_xGa_{1-x}As$ whose emission is around 980 nm. In fact, 785 nm is a standard wavelength to excite InGaAs/GaAs quantum dots (5) and a layer of GaAs only 100-nm-thick is enough to absorb>64% of light.

These photo generated carriers diffuse easily in high quality GaAs at low temperature so that the probability of capture by the quantum dots (5) is very high. The quantum light emitting device object of the invention, can be adapted to other spectral windows like fiber telecommunications windows (1.31 microns, 1.55 microns, etc.) or free space telecommunications in the visible and ultraviolet ranges. For this purpose we can proceed to change GaAs based combination of materials for InP based combination of materials, GaN based combination of materials or other suitable combinations of materials which allow covering the relevant spectral range.

The invention provides the upper diode (3) with the capacity of applying an electric field to the quantum light emitters (5) without affecting the process of electrical carrier injection (which occurs in the lower diode (1)). This electric field is used to modulate the emission of quantum light emitters (5) in intensity and energy through the Stark effect and to control its charge by Coulomb blockade mechanism. With this, the emission control of quantum light emitters (5) can be performed regardless of the level of current and carrier injection that is one of the fundamental problems of the design of two terminals.

In yet another embodiment of the invention it is possible to produce photonic structures like a photonic crystal microcavity on the device of the invention, as well as any other photonic component such as: mirrors, waveguides, light couplers and dividers, . . . or mechanical component such as: pillars, membranes (61), cantilevers (62), The implementation of such features requires from no additional efforts to those already existing in conventional designs using known fabrication techniques. By implementing said features, the whole device still acts as a monolithic quantum light source without intervention of external light sources.

An insertion photonic structures is preferably primed in the fifth layer of semiconductor material (32), hence embedding the quantum light emitters (5) when present in the fifth layer of semiconductor material (32). It must be noted though, that the sixth layer of semiconductor material (33) may be provided on top of said fifth layer of semiconductor material (32); in this very case the photonic structures may be comprised in both said fifth and sixth layers of semiconductor material (32, 33).

Leaving apart the mechanisms of generation and absorption of light, the electronic design of the device of the invention is similar to a BJT type transistor in common base configuration. However, the design of the device should be modified in order to eliminate the parasitic transistor effect. To do this, the intermediate doped regions (13+31) (base of the bipolar transistor) must be designed carefully (thickness and composition) to remove the injection of majority carriers from an intrinsic zone to the other. Thus, the interconnection between the two diodes is purely optical avoiding accumulation of unwanted charge in the quantum light emitters.

The device of the invention may be manufactured in such a way that enables the device as a tunable monolithic quantum light source, like the device depicted in FIG. 4 which corresponds to a p-i-n-i-p configuration. The device of FIG. 4 provides independent source brightness and voltage control of the quantum emitter properties.

Figure 5:
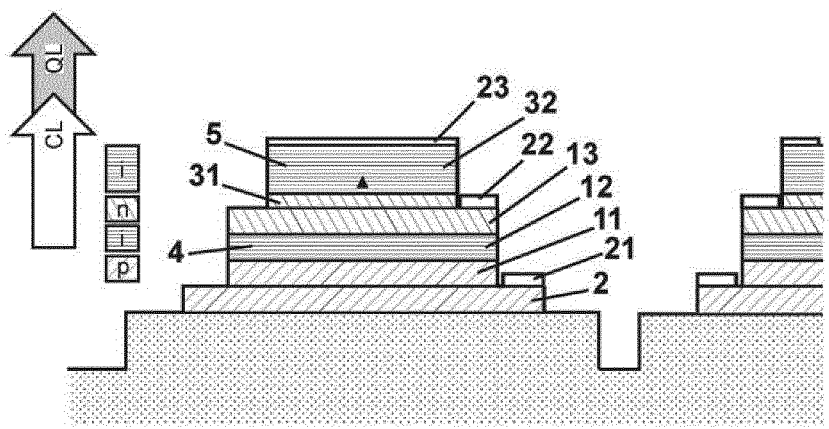
FIG. 5.—Shows an illustration of the device of the invention with top doped layer exchanged by a top Schottky contact.

However, modifications to the structure of the device may be applied rendering different embodiments and applications of the device, in this sense a tunable monolithic quantum light source p-i-n-i-Schottky configuration as the one depicted in FIG. 5 may be obtained by replacing the sixth layer of semiconductor material (33) with a metallic Schottky contact; this allows the device to provide independent source brightness and voltage control of the quantum emitter properties.

The quantum light emitters comprised in the fifth layer of semiconductor material (32) might be of non-epitaxial nature and deposited by several methods on the fourth layer of semiconductor material (31). In this case, voltage tune ability of quantum light emitter properties might be still accomplished replacing the sixth layer of semiconductor material (33) with an electrical isolating material and applying gating voltages through metallic layer (23) like in a metal-insulator-semiconductor transistor; this allows the device to provide independent source brightness and voltage control of the quantum emitter properties.

Figure 6:
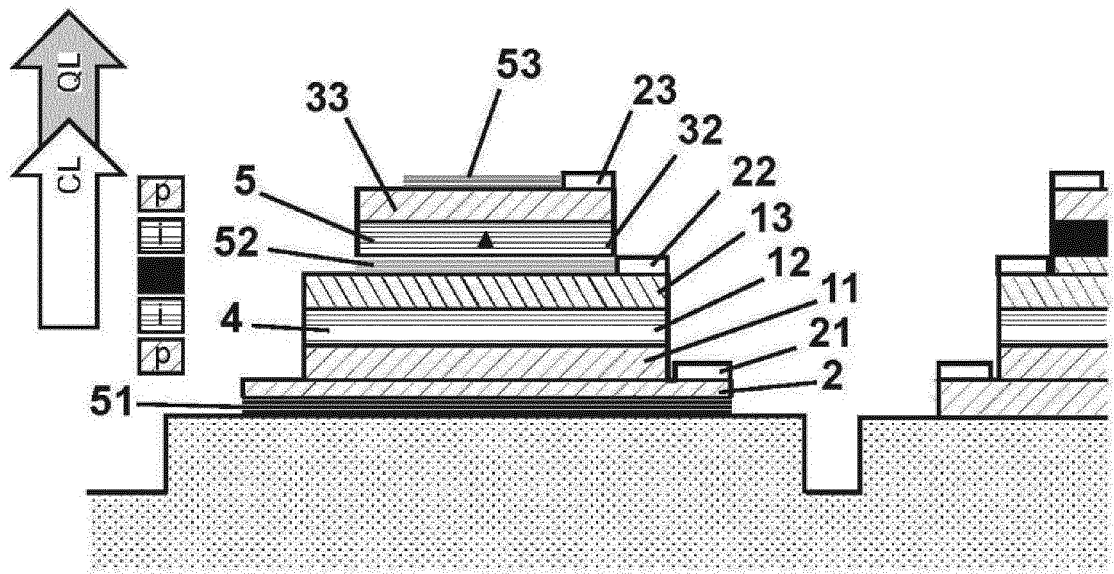
FIG. 6.—Shows an illustration of p-i-n-i-p configuration of the device of the invention encompassing mirrors and Bragg reflectors.
Figure 7:
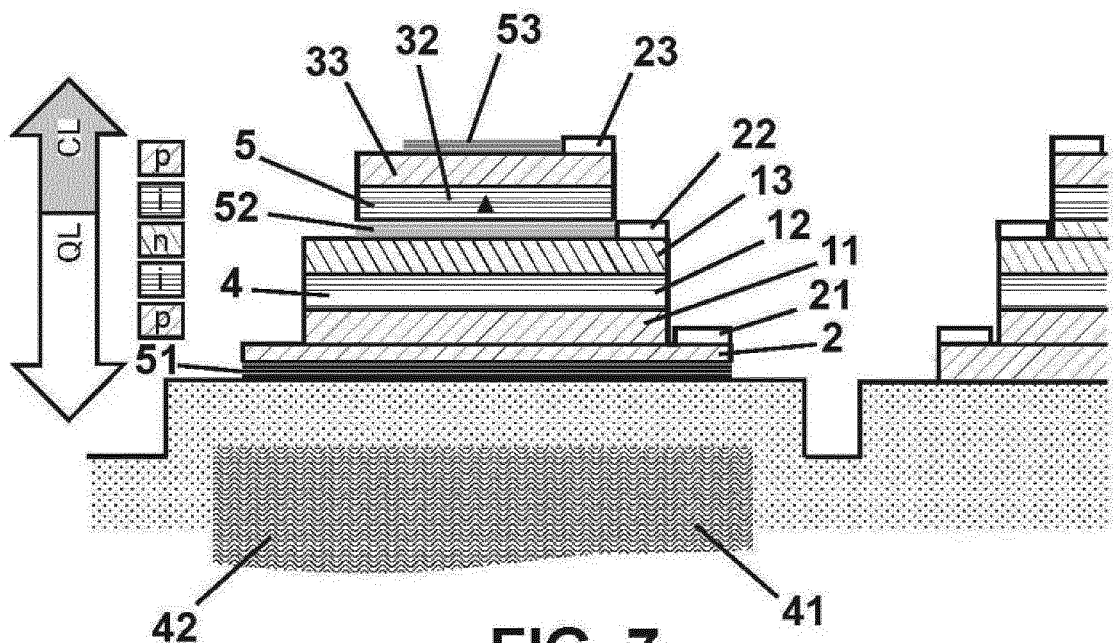
FIG. 7.—Shows an illustration of the device of the invention modified in such a way that quantum light is extracted from the substrate side.

The device of the invention may be also provided with Bragg reflectors and mirrors (51, 52, 53) encompassing optically active layers, as depicted in FIG. 6. In a simple design, with the quantum emitters (5) allocated in layers above those layers comprising quantum wells (4), a single bottom Bragg mirror (51) reflects the light emitted by the quantum wells (4) in the substrate direction back to the quantum light emitter (5) regions. A second Bragg mirror (51) can be allocated in between the two diodes (1,3) to selectively reflect the quantum light upwards. Alternately or simultaneously, a top metallic mirror (53) might reflect all light back down to the block (2). This and other uses of Bragg reflectors and mirrors (51,52,53) allow to manage the propagation of classical and quantum light streams in an essentially vertical direction (namely, parallel to the growth direction); as the skilled person would appreciate the configuration of the Bragg reflectors and mirrors (51,52,53) may depend on the arrangement of quantum wells (4) and quantum emitters (5). Their location and number might also be designed to narrow the spectral bandwidth and increase the modulation rate and depth of the source. A typical configuration is depicted on FIG. 7, where the device has a p-i-n-i-p configuration with Bragg reflectors and/or mirrors of different types allowing the reflection of quantum light (QL) through the block (2) towards the optically engineered substrate. This is achieved by furnishing the block (2) or the substrate with optical fiber shroud couplers (41), antireflection coatings (42), . . . and getting the quantum light (QL) reflected by the top Braggs reflectors and/or mirrors. This latter configuration renders an embodiment where at least one of: optical fiber shroud coupler (41) and anti-reflecting coatings (42); is arranged either on the block (2) or the substrate so that quantum light passes through the block (2).

Figure 8:
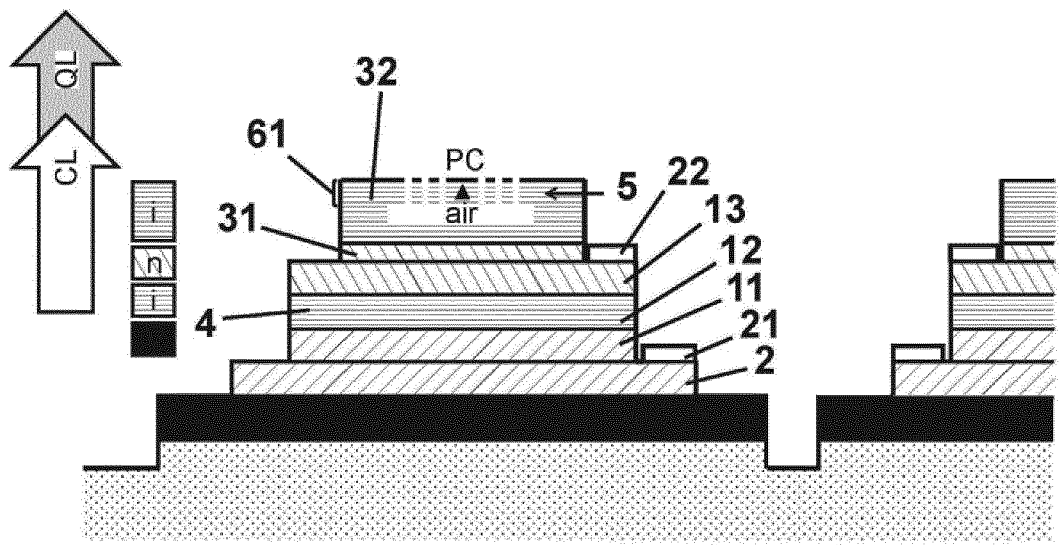
FIG. 8.—Shows an illustration of the device of the invention where quantum emitters are embedded in photonic crystal (PC) structures within a membrane and their quantum light emission can be electrically driven within the same device.

The device of the invention may further comprise one or more thin membranes (61) which in turn may comprise the quantum emitters (5), such as quantum dots (5). Thus, the membranes (61) may be fabricated on the sixth layer of semiconductor material (33) or the fifth layer of semiconductor material (32) creating an air gap underneath the quantum dots (5). The membranes (61) may also comprise photonic structures like photonic crystals (PC) to furnish the quantum light emitter (5) with a dielectric environment that modifies the light-matter coupling and/or the light propagation. FIG. 8 shows the resulting device with the membranes (61) on the fifth layer of semiconductor material (32) modified to allocate one or more photonic structures each, in this embodiment there may be or not further layers on top of the fifth layer of semiconductor material (32). The photonic structures may comprise one or more quantum emitters (5). The whole device is able to emit quantum light without the intervention of external light sources while enhancing the light-matter coupling and/or tailoring the light propagation. The device resulting from this embodiment may present one membrane (61) fabricated on the fifth layer of semiconductor material (32) defining an air gap underneath the quantum emitters (5), as earlier stated, said membrane (61) may comprise photonic structure being a light trapping or guiding structures like photonic crystal structures embedding the quantum light emitters (5). As the skilled person would acknowledge this may solve any existing limitations of prior art in order to perform the same task.

Figure 9:
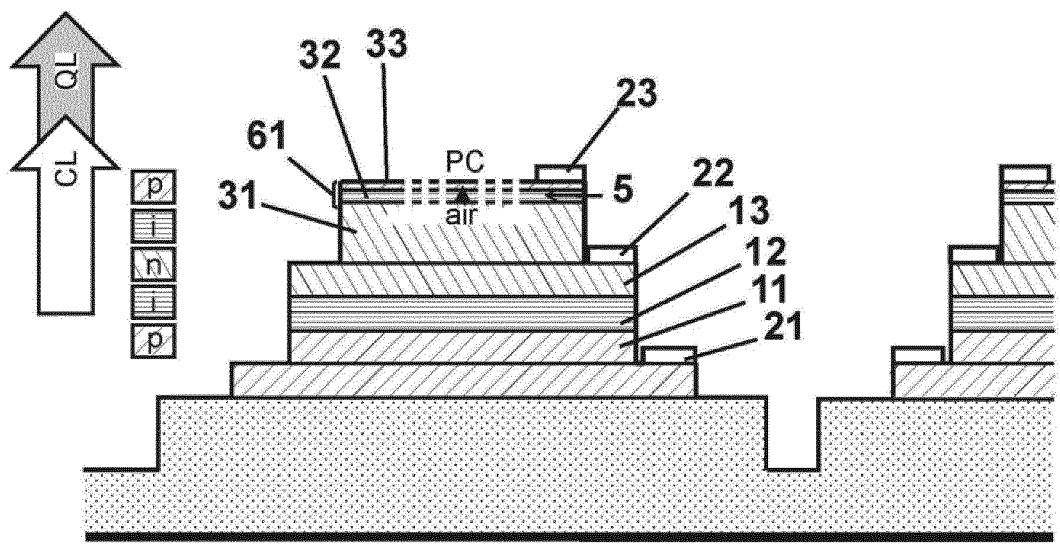
FIG. 9.—Shows an illustration of the device of the invention where the properties of quantum emitters (like wavelength, charging state) can be electrically tuned by the applied voltage while embedded in photonic crystal (PC) structures within a membrane.

The device of FIG. 8 can be completed restoring back the sixth layer of semiconductor material (33) and third metal layer (23) or adding a top Schottky contact or metal-insulator structure as abovementioned. Thus, the upper diode (3) structure may embed the fifth layer of semiconductor material (32) in turn comprising the quantum emitters (5). The membranes (61) and/or the photonic structures may be manufactured directly on this upper diode (3) structure. The whole device, shown in FIG. 9, is able to emit quantum light without the intervention of external light sources and at the same time quantum emitters are electrically tuned while embedded in PC structures.

Membranes (61) are also useful to modify the quantum emitter properties thorough external elements like stress transducers (63) preferably piezotransducers, electrical resistances acting as heaters, etc. allocated on top or nearby. In these embodiments, there may be no further layer on top of the sixth layer of semiconductor material (33) as shown in FIG. 10 or the full upper diode structure (3) might be preserved as shown in FIG. 11. External stress and/or heat is applied locally by said transducers (63) to further modify the properties of embedded quantum emitters (5) and increase the tuning capabilities of the device without affecting its other functions. The whole device is a tunable quantum light emitting device which works without the intervention of external light sources.

In another aspect of the invention, and taking into account that the quantum light emitting device of the invention would be manufactured using a substrate from which different components of the device are defined using epitaxy, more than one device could be generated on the substrate defining an integrated optical circuit or quantum photonic circuit which comprises at least two devices like the ones hereby described.

FIG. 12 shows an example of an array of two such devices where monolithic quantum light sources have their semiconductor and metal layers selectively removed or modified to implement independent voltage bias schemes and integrate different functionalities in the same wafer. The devices can be driven independently channeling the current and the voltage to emit or detect quantum light or alter the properties of quantum emitters. At the same time, the quantum light emission can be electrically driven within the circuit.

FIG. 13 shows an example of quantum optical circuit where two or more devices in the same substrate are connected by light waveguides and absorbers. The functionality of such circuits can be largely enhanced by adding membranes (61) which hold photonic structures and/or external transducers as described above. The result is shown in FIG. 14. Each device in the circuit can be driven independently to emit, detect or alter the properties of quantum light. At the same time, the quantum light emission can be electrically driven within the circuit.

Any of the above embodiments can be modified to contain nano-optomechanical systems such as cantilevers (62) with embedded quantum light emitters (5). An example is shown in FIG. 15 where part of the fifth layer of semiconductor material (32) has been shaped in the form of a cantilever (62) embedding one or more quantum emitters (5). In this embodiment there may be no further layer on top of the sixth layer of semiconductor material (33). The whole device will emit quantum light in an environment suitable for quantum optomechanical metrology and sensor applications. It does so without the intervention of external light sources. The resulting device provides the fifth layer of semiconductor material (32) comprising a mechanical oscillator, such as a cantilever (62).

Although quantum light emitters (5) may be arranged in different layers according to the respective embodiment, the fifth layer of semiconductor material (32) may be the one comprising the quantum light emitters (5); in this case, said quantum light emitters (5) may be located either on top of said fifth semiconductor material (32) or below said fifth semiconductor material (32).

In possible further embodiments, the device of the invention may be further furnished with one or more current blocking layers to channel the electrical current flow through the device. These current blocking layers may be incorporated in any of the embodiment above described.

Regardless of the configuration of the device, the substrate and the layers of semiconductor material (11, 12, 13, 31, 32, 33) may be made of a material or combination of materials selected from the group consisting of: III-V compound semiconductors, II-VI compound semiconductors, and group IV semiconductors.

In a second aspect of the invention, an integrated optical circuit or quantum photonic circuit comprising at least two devices as the device of the first aspect of the invention is provided.

The invention claimed is:

1. A quantum light source device, which is monolithic and mounted on a substrate of semiconductor material selected from the group consisting of: p-type semiconductor material, n-type semiconductor material and intrinsic semiconductor material, comprises:

a lower diode located on top of the substrate and comprising:
  a block of semiconductor material selected from the group consisting of: p-type semiconductor material and n-type semiconductor material; the block having the same type of doping as the substrate, when the substrate is doped,
  a first layer of semiconductor material arranged on the block and having the same type of doping as the block of semiconductor material,
  a second layer of semiconductor material located on the first layer of semiconductor material and comprising in turn: at least a quantum well or at least one quantum light emitter,
a third layer of semiconductor material located on the second layer of semiconductor material and made of:
  p-type semiconductor material when the first layer of semiconductor material is of n-type semiconductor material, or n-type semiconductor material when the first layer of semiconductor material is of p-type semiconductor material, an upper diode located on top of the lower diode and comprising:

a fourth layer of semiconductor material arranged on the third layer of semiconductor material and made of:

p-type semiconductor material when the first layer of semiconductor material is of n-type semiconductor material, or n-type semiconductor material when the first layer of semiconductor material is of p-type semiconductor material, a fifth layer of semiconductor material located on top of the fourth layer of semiconductor material and comprising in turn:

at least one quantum well when the second layer of semiconductor material comprises at least one quantum light emitter, or at least one quantum light emitter when the second layer of semiconductor material comprises at least one quantum well, a sixth layer of semiconductor material arranged on the fifth layer of semiconductor material, and made of:

n-type semiconductor material when the first layer of semiconductor material is of n-type semiconductor material, or p-type semiconductor material when the first layer of semiconductor material is of p-type semiconductor material, a first metal layer located either on the first layer of semiconductor material or the block of semiconductor material generating an ohmic electrical contact to at least one of the first layer of semiconductor material or the block of semiconductor material, a second metal layer, located either on the third layer of semiconductor material or the fourth layer of semiconductor material generating an ohmic electrical contact to at least one of the third layer of semiconductor material or the fourth layer of semiconductor material, and a third metal layer, located on the sixth layer of semiconductor material generating an ohmic electrical contact to the sixth layer of semiconductor material.

2. The quantum light source device according to claim 1 wherein the second layer of semiconductor material comprises at least one quantum well, wherein the sixth layer of semiconductor material is replaced by an electrical isolating layer or a metallic layer.

3. The quantum light source device according to claim 1 wherein the second layer of semiconductor material comprises at least one quantum well and the third metal layer and the sixth layer of semiconductor material are removed.

4. The quantum light source device according to claim 1, further comprising Bragg reflectors and mirrors to reflect at least part of the light emitted from the semiconductor materials of at least one of the diodes.

5. The quantum light source device according to claim 4 wherein the maximum total number of Bragg reflectors and mirrors are four.

6. The quantum light source device according to claim 1, further comprising at least one of: optical fiber shroud coupler and anti-reflecting coatings; arranged either on the block or on the substrate, so that quantum light passes through the block.

7. The quantum light source according to claim 1, further comprising at least one membrane fabricated on the fifth layer of semiconductor material, which comprises the quantum emitters, defining an air gap underneath the quantum emitters.

8. The quantum light source according to claim 1, further comprising at least one photonic structure in the fifth layer of semiconductor material comprising the quantum emitters.

9. The quantum light source according to claim 7, wherein the membrane comprises at least one photonic structure.

10. The quantum light source according to claim 1, wherein the fifth layer of semiconductor material comprises a mechanical oscillator.

11. The quantum light source device according to claim 1, further comprising one or more current blocking layers to channel the electrical current flow through the device.

12. The quantum light source device according to claim 1, wherein the substrate and the first layers of semiconductor material, the second layer of semiconductor material, the third layer of semiconductor material, the fourth layer of semiconductor material, the fifth layer of semiconductor material and the sixth layer of semiconductor material are made of a material or a combination of materials selected from the group consisting of: III-V compound semiconductors, II-VI compound semiconductors, and group IV semiconductors.

13. A quantum optical circuit comprising at least two devices wherein each device is a quantum light source device, which is monolithic and each device comprises:

a substrate of semiconductor material selected from the group consisting of: p-type semiconductor material, n-type semiconductor material and intrinsic semiconductor material;

a lower diode located on top of the substrate and comprising:

a block of semiconductor material selected from: p-type semiconductor material and n-type semiconductor material; the block having the same type of doping as the substrate when the substrate is doped, a first layer of semiconductor material arranged on the block and having the same type of doping as the block of semiconductor material, a second layer of semiconductor material located on the first layer of semiconductor material and comprising in turn: at least a quantum well or at least one quantum light emitter, a third layer of semiconductor material located on the second layer of semiconductor material and made of:

p-type semiconductor material when the first layer of semiconductor material is of n-type semiconductor material, or n-type semiconductor material when the first layer of semiconductor material is of p-type semiconductor material, an upper diode located on top of the lower diode and comprising:

a fourth layer of semiconductor material arranged on the third layer of semiconductor material and made of:

p-type semiconductor material when the first layer of semiconductor material is of n-type semiconductor material, or n-type semiconductor material when the first layer of semiconductor material is of p-type semiconductor material, a fifth layer of semiconductor material located on top of the fourth layer of semiconductor material and comprising in turn:
   at least one quantum well when the second layer of semiconductor material comprises at least one quantum light emitter, or
   at least one quantum light emitter when the second layer of semiconductor material comprises at least one quantum well,
a sixth layer of semiconductor material arranged on the fifth layer of semiconductor material, and made of:
   n-type semiconductor material when the first layer of semiconductor material is of n-type semiconductor material, or
   p-type semiconductor material when the first layer of semiconductor material is of p-type semiconductor material, a first metal layer located either on the first layer of semiconductor material or the block of semiconductor material generating an ohmic electrical contact to at least one of the first layer of semiconductor material or the block of semiconductor material, a second metal layer, located either on the third layer of semiconductor material or the fourth layer of semiconductor material generating an ohmic electrical contact to at least one of the third layer of semiconductor material or the fourth layer of semiconductor material, and a third metal layer, located on the sixth layer of semiconductor material generating an ohmic electrical contact to the sixth layer of semiconductor material.

* * * * *